United States Patent
Yin

[19]

[11] Patent Number: 6,160,707
[45] Date of Patent: Dec. 12, 2000

[54] BRACKET FOR MOUNTING A CIRCUIT BOARD ASSEMBLY ON A MOTHER BOARD

[75] Inventor: Ji-Zhong Yin, Fremont, Calif.

[73] Assignee: Micronics Computers, Inc., Fremont, Calif.

[21] Appl. No.: 09/241,107

[22] Filed: Feb. 1, 1999

[51] Int. Cl.[7] .............................. H05K 7/20; H01R 13/62
[52] U.S. Cl. ......................... 361/704; 361/759; 361/809; 439/328; 439/358
[58] Field of Search ..................................... 361/704, 707, 361/710, 715, 732, 740–741, 747, 754, 756, 759, 788, 801, 807, 809–810; 439/64, 157, 160, 325, 327–328, 352–353, 357–358, 372, 377

[56] References Cited

U.S. PATENT DOCUMENTS

| | | | |
|---|---|---|---|
| 5,649,831 | 7/1997 | Townsend | 439/328 |
| 5,885,097 | 3/1999 | Chen | 439/328 |
| 5,980,295 | 11/1999 | Lai et al. | 439/327 |

*Primary Examiner*—Gregory Thompson
*Attorney, Agent, or Firm*—Fenwick & West LLP

[57] ABSTRACT

Computer apparatus 10 includes mother board 10M, bracket 12 mounted on the mother board, a circuit board assembly 10A installed in the bracket, and a pair of assembly latches 13L and 13R. The mother board has connector slot 12E for electrically engaging corresponding contacts 10E on the circuit board assembly. The bracket has an elongated base member 12M positioned proximate the connector slot, and a pair of spaced retaining posts 12L and 12R extending generally away from the mother board, one at each end of the base member. The bracket receives the circuit board assembly into the space between the retaining posts. The circuit board assembly has heat conductive thermal plate 14 between circuit board 10C and heat sink 14H. The thermal plate has two end edges 14L and 14R, one proximate each retaining post, which are engaged by the retaining posts during and after installation. Each retaining post has a latch port 12P extending therethrough. Assembly latches 13L and 13R cooperate with the retaining posts through the latch port for latching the circuit board assembly into the bracket after installation. The assembly latches are displaceable from an engaged position E to a released position R, and further into a released-lock position L.

21 Claims, 3 Drawing Sheets

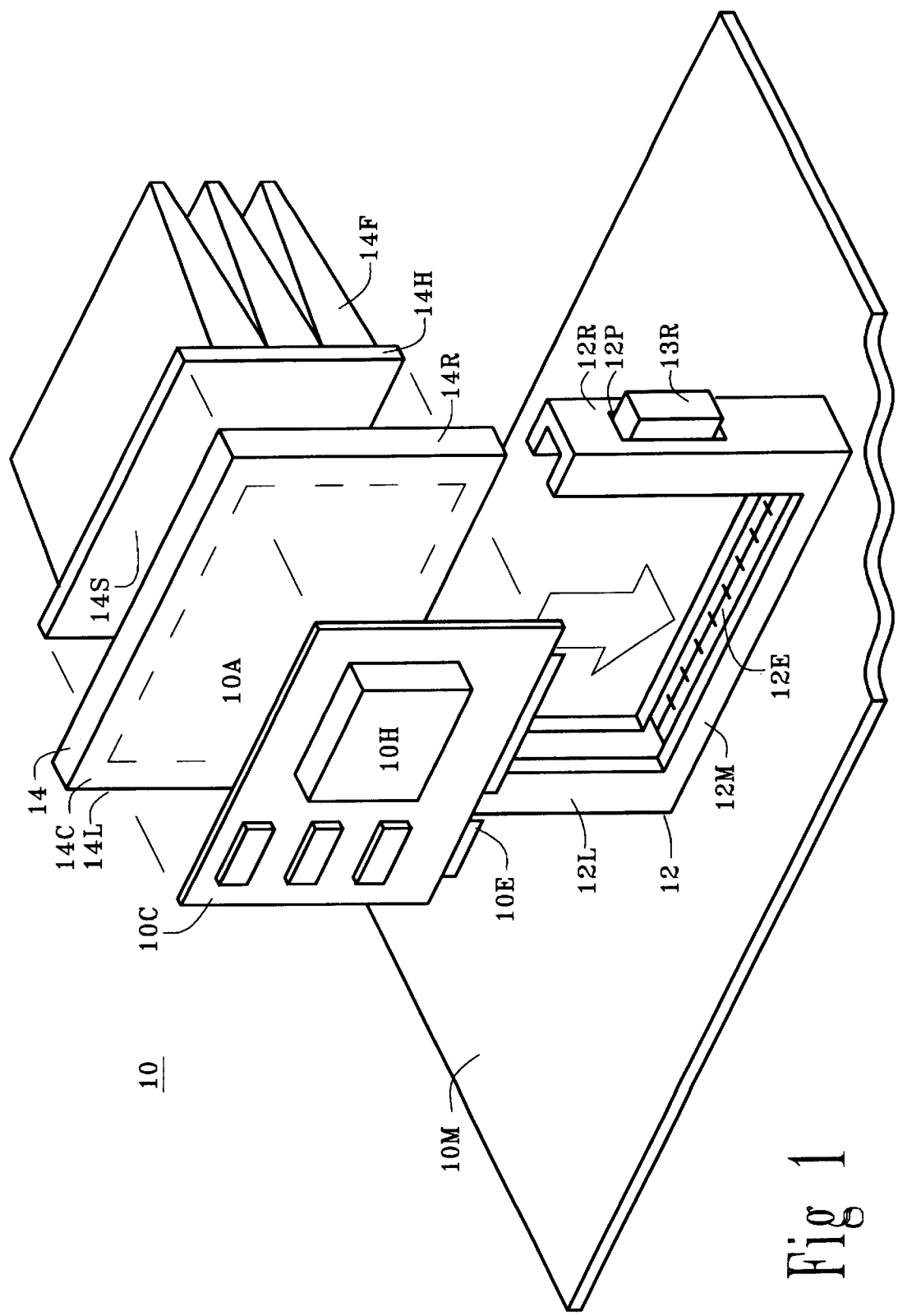

BRACKET FOR MOUNTING A CIRCUIT BOARD ASSEMBLY ON A MOTHER BOARD

TECHNICAL FIELD

This invention relates to circuit board assembly brackets, and more particularly to such brackets with an engaged position and a released position and a released-lock position.

BACKGROUND

Add-on circuit boards are becoming larger and more complex, and generate more heat. These boards are commonly mounted vertically with a massive on-board heat sink and cooling fins forming an assembly to remove the heat into the ambient air flow. Various vertical mounting brackets have been employed to provide lateral support for the added weight of the sink and fins. Horizontally mounted circuit board assembles are secured to the mother board and do not require the vertical lateral support. However the horizontal boards do not tower above the mother board, where they can be cooled on both sides by ambient air. U.S. Pat. No. 5,889,656 issued on Mar. 30, 1999 to the present inventor (currently allowed application Ser. No. 08/862,656 filed on May 23, 1997, assigned to the present assignee) discloses a vertical mother board bracket with pivoting retaining arms for receiving an add-on circuit board. The pivoting permits three positions of the retaining arms with respect to the mother board, a folded storage position, an open receiving position, and an unfolded retaining position. In the folded storage position, the retaining arms are folded generally horizontally close to the mother board in a low height storage profile. In the open receiving position the retaining arms are pivoted beyond the vertical of the unfolded position for permitting ready installation of the add-on circuit board assembly. In the unfolded retaining position the retaining arms are unfolded generally vertically for mechanically retaining the ends of the add-on circuit board assembly after installation.

SUMMARY

It is therefore an object of this invention to provide an improved circuit board assembly bracket with latches which do not require folding or pivoting retaining arms.

It is another object of this invention to provide such a bracket employing a displaceable assembly latch defining three displacement positions.

It is a further object of this invention to provide such a bracket in which one of the three position is a released-lock position for facilitating installation and removal of the circuit board assembly.

It is a further object of this invention to provide such a bracket in which the assembly latch is formed by single piece of folded resilient material.

Briefly, these and other objects of the present invention are accomplished by providing a bracket which is mounted on a mother board to receive a circuit board assemble. The bracket has an elongated base member secured to the mother board proximate a circuit board connector slot on the mother board. The bracket has a pair of spaced retaining posts extending away from the mother board, one at each end of the base member for receiving the circuit board assembly in the space therebetween. Each retaining post has an exterior side facing away from the other retaining post, and an interior side facing toward the other retaining post. The interior side guides the circuit board assembly into electrical contact with the connector slot on the mother board during installation. In addition, the interior sides retain the circuit board assembly in contact orientation within the connector slot after installation. Each retaining post has a latch port extending therethrough. An assembly latch on the exterior side of each retaining post, cooperates with the retaining posts through the latch ports for latching the circuit board assembly after installation. Each latch has an engage structure and a release structure. Each latch is displaceable by means of the release structure from an engaged position in which the engage structure extends through the latch port engaging the circuit board assembly, to a released position in which the engage structure is displaced away from the circuit board assembly releasing the circuit board assembly. A resilient structure between the engage structure and the release structure of each assembly latch, resiliently loads the latch toward the engaged position for maintaining the latches in the engaged position after the installation of the circuit board assembly.

BRIEF DESCRIPTION OF THE DRAWING

Further objects and advantages of the present bracket and the operation of assembly latch will become apparent from the following detailed description and drawing (not drawn to scale) in which:

FIG. 1 is a perspective view of bracket 12 mounted on mother board 10M for receiving circuit board assembly 10A (exploded);

Figure 2A:
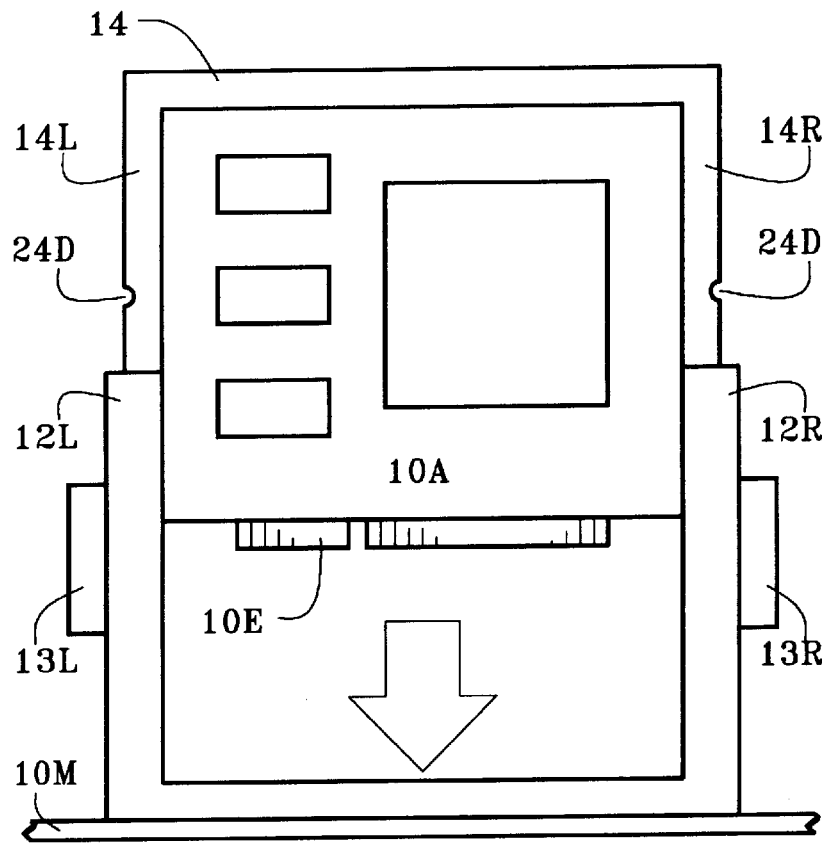
FIG. 2A is a front view of bracket 12 of FIG. 1 showing circuit board assembly 10A being installed with assembly latches 13L and 13R in the released position (or released-lock position)

The first digit of each reference numeral in the above figures indicates the figure in which that element is most prominently shown. The second digit indicates related structural elements, and a final letter (when used) indicates a sub-portion of an element.

REFERENCE NUMERALS IN DRAWING

The table below lists all of the reference numerals employed in the figures, and identifies the element designated to by each numeral.

10 Computer Apparatus 10
  10A Circuit Board Assembly 10A
  10C Circuit Board 10C
  10E Circuit Board Contacts 10E
  10H Heat Generating Computer Component 10H
  10M Mother Board 10M
12 Mounting Bracket 12
  12E Connector Slot 12E
  12L Retaining Post 12L
  12M Elongated Base Member 12M
  12P Latch Port 12P
  12R Retaining Post 12R 13L Assembly Latches 13L
13R Assembly Latches 13R
14 Thermal Plate 14
    14C Circuit Board Face 14C
    24D Detent 24D
    14F Cooling Fins 14F
    14H Heat sink 14H
    14L End Edge 14L
    14R End Edge 14R
    14S Heat Sink Face 14S
32 Retaining Post 32
    32B Raised Boss 32B
    32P Latch Port 32P
    32S Stud Projections 32S
    32U Under-Cut 32U
33 Single Piece Assembly Latch 33
34 Thermal Plate 34
    34D Detent 34D
35 Resilient Locking Finger 35
    35R Ramp Surface 35R
    35V Vertical Surface 35V
36 Foot Structure 36
37 Release Structure 37
    39R Stiffening Rib 39R
43 Single Piece Folded Material 43
    43B Obtuse Bend 43B
    43F Fold 43F
    43E Engage Structure 43E
45 Locking Finger 45
    45R Ramp Surface 45R
    45V Vertical Surface 45V
    45A Finger aperture 45A
46 Foot Structure 46
    46S Stud Holes 46S
    46C Boss Cut-Out 46C
47 Release Structure 47
    47A Locking Aperture 47A
    47E Locking Edge 47E
    47S Release Surface 47S
48 Flexible Resilient Segment 48
    48S Elongated Slots 48S
49 Release Lever Segment 49
    49R Stiffening Rib 49R

GENERAL EMBODIMENT (FIGS. 1 and 2)

Computer apparatus 10 includes mother board 10M, bracket 12 mounted on the mother board, a circuit board assembly 10A (shown in exploded view) installed in the bracket, and a pair of assembly latches 13L and 13R (see FIG. 2A). The mother board has a suitable electrical contact device such as connector slot 12E for electrically engaging corresponding contacts 10E on the circuit board assembly. The bracket has an elongated base member 12M positioned proximate the connector slot, and a pair of spaced retaining posts 12L and 12R extending generally away from the mother board, one at each end of the base member. The bracket receives the circuit board assembly into the space between the retaining posts (see FIG. 2B). The circuit board assembly has a heat conductive thermal plate 14 with a circuit board face 14C and a heat sink face 14S. The thermal plate has two end edges 14L and 14R, one proximate each retaining post, which are engaged by the retaining posts during and after installation. The circuit board assembly also has a circuit board 10C containing heat generating computer component 10H in thermal communication with the circuit board face of the thermal plate. Electrical contacts 10E on the circuit board engage the connector slot for supplying electrical power to the computer component (and related circuitry) and for processing data into and out of the computer component. The circuit board assembly also has a heat sink 14H in thermal communication with the heat sink face of the thermal plate. The heat sink receives heat generated by the computer component and conducted through the thermal plate by conduction. The heat sink has cooling fins 14F which radiate the heat into the environment. The thermal plate is sandwiched between the circuit board and the heat sink, and provides a rugged support frame for the circuit board assembly.

Each retaining post has an exterior side facing away from the other retaining post (and away from the circuit board assembly), and an interior side facing toward the other retaining post (and toward the circuit board assembly). The interior side of each retaining post has front and back flanges which guide end edges 14L and 14R of the thermal plate directing circuit board contacts 10E into electrical contact with the connector slot on the mother board during installation. The flanges then retain the thermal plate and the entire circuit board assembly, maintaining the circuit board contacts in contact orientation within the connector slot after installation. In the embodiment of FIG. 1, the retaining posts extend generally vertically away from the mother board, and define a corresponding generally vertical contact orientation for the circuit board assembly. The retaining posts prevent the retained circuit board assembly therebetween from tilting or bending or moving laterally.

Each retaining post has a latch port 12P extending therethrough. Assembly latches 13L and 13R, one on the exterior side of each retaining post, cooperate with the retaining posts through the latch port for latching the circuit board assembly into the bracket after installation. Each assembly latch has an engage structure 43E and a release structure 47 (shown in detail in FIGS. 3 and 4). The assembly latches are displaceable by means of the release structure from an engaged position (shown in FIG. 3 as position E) to a released position (shown in FIG. 3 as position R). In the engaged position E engage structure 43E extends through the latch port engaging the circuit board assembly. In the released position R the engage structure is displaced away from the circuit board assembly releasing the circuit board assembly permitting the circuit board assembly to be removed from mounting bracket 12.

A resilient mechanism (see flexible resilient segment 48 FIGS. 3 and 4) between the engage structure and release structure of each assembly latch, resiliently loads the assembly latch toward the engaged position E for maintaining the assembly latches in the engaged position E after the installation of the circuit board assembly.

Figure 2B:
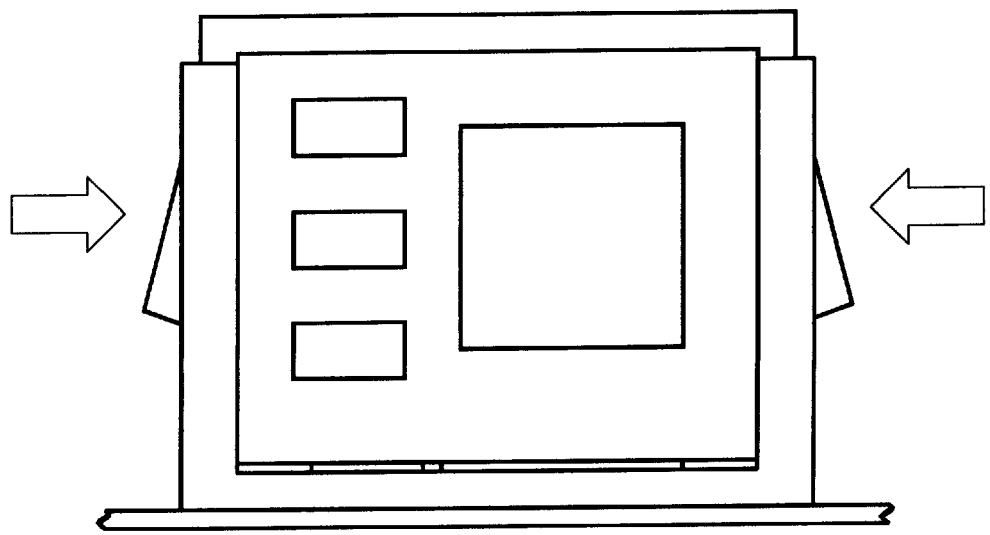
FIG. 2B is a front view of bracket 12 of FIG. 2 showing circuit board assembly 10A after installation with assembly latches 13L and 13R in the engaged position.

Installation (FIGS. 2A and 2B)

FIG. 2A shows circuit board assembly 10A being installed into the mounting bracket. The front and back flanges of retaining posts 12L and 12R are guiding end edges 14L and 14RL of thermal plate 14, directing circuit board contacts 10E of the circuit board assembly into engagement with connector slot 12E. In order for the edges of the thermal plate to move past assembly latches 13L and 13R, the latches must be in either the released position (shown in FIG. 3 as position R) or a released-lock position (shown in FIG. 3 as position L). The installer manually displaces the assembly latches from the engaged position E (shown in FIG. 3 as position E) to the released position R by simultaneously applying external pressure (indicated by arrows shown in FIG. 2B) on both latches inwardly toward the circuit board assembly. Release surface 47S (shown in FIG. 4) on release structure 47 of each assembly latch (see FIGS. 3 and 4) is responsive to external pressure for displacing the assembly latch into the released position R causing engage structure 43E to release the circuit board assembly.

The installer may further displace the assembly latches from the released position R to the released-lock position L by simultaneously applying more external pressure. This further displacement locks the assembly latches in the released-lock position L, which arrests the resilient loading of the assembly latch toward the engaged position E. The locking holds the assembly latches in the released-lock position without further external pressure from the installer. The installer thus has both hands free to install and removal the circuit board assembly. FIG. 2A shows circuit board assembly 10A installed into the bracket. Contacts 10E on the circuit board are engaged with the contacts of connector slot 12E, and the assembly latches are in the engaged position E. In the embodiment of FIG. 2A, end edges 14L and 14R of the thermal plate, each have a detent 24D or indentation therealong which accepts engage structure 43E of the assembly latches when the latches are in the engaged position E to engage the circuit board assembly.

Figure 3:
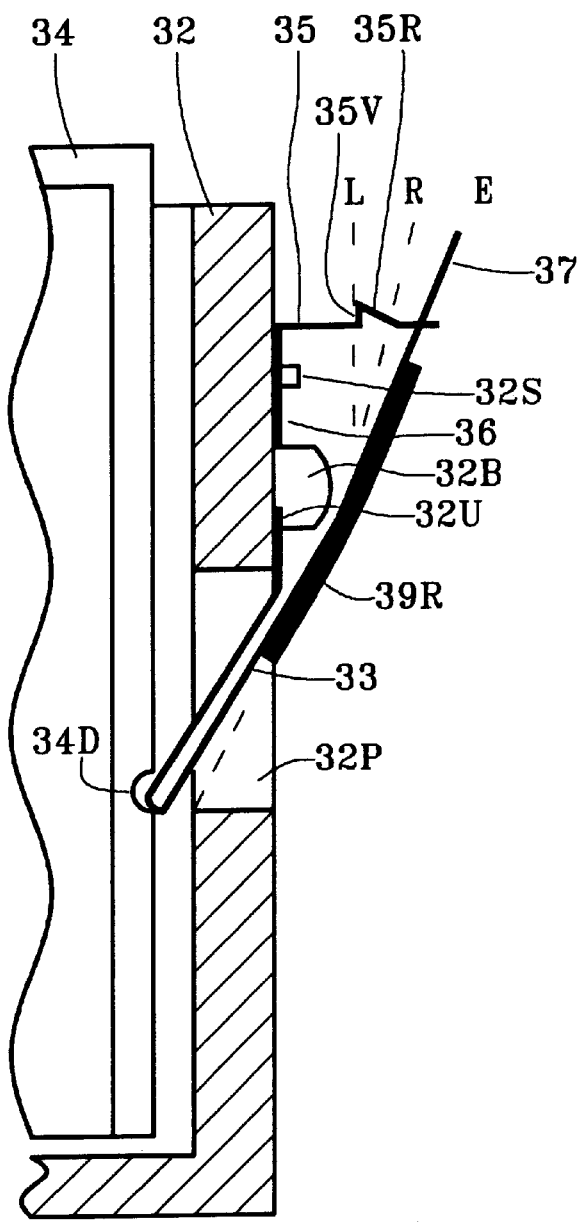
FIG. 3 is a fragmentary side view in-section of retaining post 32 securing a single piece assembly latch 33 which has three displacement positions, engaged position E, released position R and released-lock position L.

Latch Positions (FIG. 3)

The detailed structure of the assembly latch is shown in FIG. 3. Assembly latch 33 is secured to retaining post 32 and extends through latch port 32P in the retaining post for engaging detent 34D on thermal plate 34. The latch may be displaced from the engaged position E (shown in FIG. 3) into the released position R and further into the released-lock position L. A resilient locking finger 35 (45 in FIG. 4) extends away from foot structure 36 (46 in FIG. 4) on each retaining post, toward release structure 37 of cooperating assembly latch 33. The locking finger includes a locking detent which locks with locking aperture 47A in release structure 47 (see FIG. 4) for holding the assembly latch in the released-lock position L. The locking detent on each locking finger may be formed by a suitable camming mechanism such as ramp surface 35R (45R in FIG. 4) and a suitable locking mechanism such as vertical surface 35V (45V in FIG. 4) adjacent to the ramp. Ramp surface 35R of the camming mechanism faces away from the circuit board assembly, and vertical surface 35V of the locking mechanism faces toward the circuit board assembly. The ramp surface initially interacts with the release structure as the assembly latch is displaced from the released position R toward the released-lock position L in response to the external pressure. This interaction causes the resilient locking finger to deflect against the release structure. The locking surface locks with the release structure of the assembly latch as the locking finger undeflects due to the resilience thereof, causing the assembly latch to lock into the released-lock position L. In the embodiment of FIG. 3, the camming ramp is shown on the top surface of the locking finger interacting with the upper edge of locking aperture 47A pushing the locking finger downward. In another embodiment, the camming ramp may be on the bottom surface interacting with the lower edge of a locking aperture pushing the locking finger upward.

Figure 4:
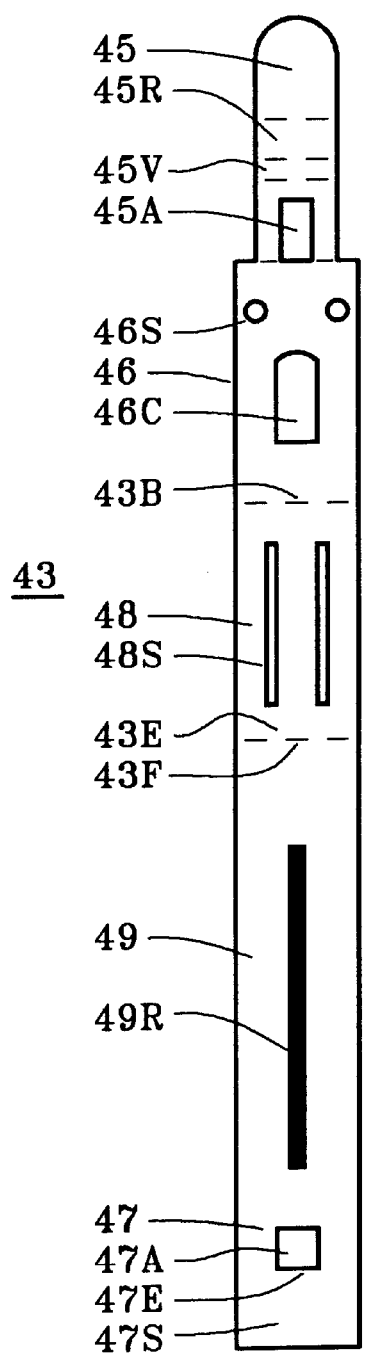
FIG. 4 is a plan view of single piece assembly latch 33 of FIG. 3 before folding showing the flat layout of the resilient material.

One Piece Assembly Latch (FIG. 4)

The assembly latch shown in FIG. 3 may be formed from a single piece of folded material 43 shown in flat lay-out in FIG. 4. Each dashed line in the flat lay-out indicates a bending axis across the single piece for the fabrication of the assembly latch. The single piece is preferably a suitably resilient material such as metal which permits bowing displacement into the released position R (and the released-lock position L). This resilience provides the return force for urging the assembly latch back into the engaged position E. Engage structure 43E forms part of fold 43F of the single piece. The fold may be a "U" fold having an angle of 180 degrees as shown in the embodiment of FIG. 3, or a lesser fold at an acute angle.

Each assembly latch may have a suitable support structure secured to the external side of the cooperating retaining post for locating the engage structure of the assembly latch proximate the latch port in the retaining post. Foot support structure 46 formed at one end (near top) of the single piece is secured to the retaining post. Release structure 47 is formed at the other end (bottom) of the single piece, but is in proximity to the foot structure due to fold 43F.

The locking fingers may form part of the single piece assembly latch. In the embodiment shown in FIG. 4, locking finger 45 is formed at the one end (top) of the assembly latch. A suitable locking device such as locking aperture 47A is formed in release structure 47 for capturing the locking finger as external pressure is applied to release surface 47S. Locking edge 47E formed by a portion of the locking aperture interacts with camming ramp surface 45R and vertical locking surface 45V as the assembly latch is displaced from the engaged position E into the released-lock position L. A finger void or aperture 45A is formed in the material of the locking finger between the locking detent and the foot structure. The finger void enhances the deflection of the locking finger by reducing the locking finger resilience. The finger void permits the displacing assembly latch to more easily deflect the locking finger and enter the released-lock position L. In another embodiment, the finger void may be narrow section in the locking finger instead of a central aperture.

The single piece assembly latch has an obtuse bend 43B therein proximate the latch port which locates the engage structure within latch port 32P for engagement with the circuit board assembly. The resilient mechanism of the assembly latch may be flexible resilient segment 48 formed in single piece 43 between foot structure 46 and engage structure 43E. The resilient segment permits the bowing displacement of the assembly latch from the engaged position E into the released position R and further displacement into the released-lock position L. The bowed resilient segment urges the assembly latch to return from the released-lock position L and the released position R back into the engaged position E. Elongated void or slots 48S formed in resilient segment 48 and extending therealong may be employed for enhancing the bowing displacement by reducing the resilience of the resilient segment. Because of these elongated slots, the resilient segment has less resilient material, and is therefore more susceptible to yielding under bending moments to provide displacement bowing. As a result, less external pressure is required by the installer to displace the assembly latch from the engaged position E into the released position R (and the released-lock position P). Release lever segment 49 formed in the single piece between engage structure 43E at fold 43F of the single piece assembly latch, and the release surface on the release structure at the other end (bottom) of the single piece. A long release lever segment provides mechanical advantage which reduces the external pressure required to displace the engage structure from the engaged position E into the released position R (or released-lock position L). Stiffening rib 49R (shown as 39R in FIG. 3) extends along the release lever segment for reducing bending thereof due to the external pressure. The stiffening rib may be an elongated central dimple as shown in FIG. 4, or a bend flange along one or both edges of the release lever segment.

Raised boss 32B extends from the exterior side of each retaining post towards the lever segment of the assembly latch. The boss holds the lever segment away from the retaining post to assist in bowing displacement of the engage structure. Boss cut-out 46C through foot structure 46 permits the raised boss to extend through the single piece assembly latch. Under-cut 32U in the raised boss is flush with to the retaining post for receiving an edge of the boss cut-out in the foot structure. This flush configuration permits the foot structure to be secured flush against the retaining post. Stud projections 32S in the retaining post extend through correspondingly located stud holes 46S in the foot structure to prevent lateral slipping movement between the foot structure and the retaining post.

INDUSTRIAL APPLICABILITY

It will be apparent to those skilled in the art that the objects of this invention have been achieved as described hereinbefore by providing a circuit board assembly bracket with latches which do not require retaining arms that fold or pivot. These retaining arms have a displaceable assembly latch with three displacement positions including a released-lock position for facilitating installation and removal of the circuit board assembly. Further, the assembly latch may be formed by single piece of folded resilient material.

CONCLUSION

Clearly various changes may be made in the structure and embodiments shown herein without departing from the concept of the invention. Further, features of the embodiments shown in the various figures may be employed with the embodiments of the other figures.

Therefore, the scope of the invention is to be determined by the terminology of the following claims and the legal equivalents thereof.

I claim as my invention:

1. A bracket for mounting on a mother board to receive a circuit board assemble, comprising:
    an elongated base member for engaging the mother board proximate a circuit board connector slot on the mother board;
    a pair of spaced retaining posts extending away from a mother board, one at each end of the base member for receiving the circuit board assembly in the space therebetween, each retaining post having an exterior side facing away from the other retaining post, each retaining post having an interior side facing toward the other retaining post for guiding the circuit board assembly into electrical contact with the connector slot on the mother board during installation, and for retaining the circuit board assembly in contact orientation within the connector slot after installation, each retaining post having a latch port extending therethrough;
    a pair of assembly latches one on the exterior side of each retaining post, which cooperate with the retaining posts through the latch ports for latching the circuit board assembly after installation, each assembly latch having an engage structure and a release structure, each assembly latch displaceable by means of the release structure from an engaged position in which the engage structure extends through the latch port engaging a circuit board assembly, to a released position in which the engage structure is displaced away from the circuit board assembly releasing the circuit board assembly; and
    resilient means effective between the engage structure and the release structure of each assembly latch, for resiliently loading the assembly latches toward the engaged position for maintaining the assembly latches in the engaged position after the installation of the circuit board assembly.

2. The bracket of claim 1, further comprising; a release surface on the release structure of each assembly latch responsive to external pressure for displacing the assembly latch into the released position causing the engage structure to release the circuit board assembly.

3. The bracket of claim 2, wherein each assembly latch is further displaceable from the released position into a release-locked position for arresting the resilient loading of each assembly latch toward the engaged position to facilitate the installation and removal of the circuit board assembly.

4. The bracket of claim 3, further comprising:
    a resilient locking finger extending away from each retaining post toward the release structure of the cooperating assembly latch; and
    a locking detent on each locking finger for holding the cooperating assembly latch in the released-lock position.

5. The bracket of claim 4, wherein each assembly latch further comprises:
    a foot structure secured to the external side of the cooperating retaining post for locating the engage structure of each assembly latch proximate the latch port through each retaining post.

6. The bracket of claim 5, wherein each assembly latch is a single piece of folded material forming
    the engage structure at the fold of the single piece, and
    the foot structure at one end of the single piece, and the release structure at the other end of the single piece is in proximity to the foot structure due to the fold in the single piece.

7. The bracket of claim 6, wherein the resilient means is a flexible resilient segment formed in the single piece assembly latch between the foot structure and the engage structure,
    which bows to permit the displacement of each assembly latch from the engaged position into the released position, and
    which further bows to permit displacement into the released-lock position, and
    which urges each assembly latch back from the released-lock position and released position into the engaged position.

8. The bracket of claim 7, wherein the single piece assembly latch further comprises an elongated void formed in the resilient segment extending along the resilient segment for enhancing the bowing by reducing the resilience of the resilient segment.

9. The bracket of claim 6, wherein the single piece assembly latch further comprises:
    a release lever segment formed in the single piece between the engage structure at the fold of the single piece assembly latch and the release surface on the release structure at the other end of the single piece assembly latch, for reducing the external pressure required to displace the engage structure.

10. The bracket of claim 9, further comprising a raised boss extending from the exterior side of each retaining post towards the lever segment for holding the lever segment away from the retaining post to assist in displacement of the engage structure.

11. The bracket of claim 9, further comprising a boss cut-out through the foot structure of each single piece assembly latch permitting the raised boss to extend through the single piece.

12. The bracket of claim 11, further comprising an undercut in the raised boss flush with each retaining post for receiving an edge of the cut-out in the foot structure to secure the foot structure flush against each retaining post.

13. The bracket of claim 12, further comprising:

stud holes in each foot structure; and corresponding stud projections in each retaining post extending into the stud holes for preventing lateral movement between each foot structure and the cooperating retaining post.

14. The bracket of claim 9, wherein the release lever segment further comprises a stiffening rib extending along the release lever segment for reducing bending thereof due to the external pressure.

15. The bracket of claim 6, wherein the locking fingers are part of the single piece assembly latch, and are formed at the one end thereof extending away from the foot structure toward the release structure.

16. The bracket of claim 15, wherein the single piece assembly latch further comprises a finger void formed in the locking finger between the locking detent and the foot structure for enhancing the deflection by reducing the resilience of the locking finger.

17. The bracket of claim 15, wherein the locking detent on each locking finger comprises:

a camming surface facing away from the circuit board assembly which initially interacts with the release structure of the cooperating assembly latch as the assembly latch is displaced from the released position to the released-lock position in response to the external pressure, which interaction causes the locking finger to deflect against the resilience of the locking finger; and a locking surface facing toward the circuit board assembly for locking with the release structure of the assembly latch as the locking finger undeflects due to the resilience of the locking finger, causing the assembly latch to lock into the released-lock position.

18. The bracket of claim 17, further comprising;

a locking aperture formed in the release structure for capturing the locking finger; and a locking edge formed by a portion of the locking aperture for interacting with the camming surface and locking surface as the assembly latch is displaced from the engaged position to the released-lock position.

19. The bracket of claim 6, wherein the single piece assembly latch has an obtuse bend therein proximate the latch port for locating the engage structure within the latch port for engagement with the circuit board assembly.

20. Computer apparatus comprising:

a mother board having at least one circuit board connector slot;

a bracket mounted on the mother board, the bracket having an elongated base member proximate the circuit board connector slot, the bracket having a pair of spaced retaining posts extending generally away from the mother board, one at each end of the base member;

a circuit board assembly installed in the bracket between the retaining posts formed by a heat conductive thermal plate having a circuit board face and a heat sink face and an end edge proximate each retaining post, a circuit board containing heat generating computer component means in thermal communication with the circuit board face of the thermal plate, and having electrical contacts for supplying electrical power to the computer component means and for processing data into and out of the computer component means, and a heat sink in thermal communication with the heat sink face of the thermal plate for receiving heat generated by the computer component means through the thermal plate and radiating the heat;

each retaining post having an exterior side facing away from the circuit board assembly, and an interior side facing toward the circuit board assembly for guiding the edges of thermal plate for directing the circuit board contacts into electrical contact with the connector slot on the mother board during installation, and for retaining the circuit board assembly in contact orientation within the connector slot after installation;

each retaining post having a latch port extending therethrough;

a pair of assembly latches one on the exterior side of each retaining post, which cooperate with the retaining posts through the latch port for latching the circuit board assembly into the bracket after installation, each assembly latch having an engage structure and a release structure, each assembly latch displaceable by means of the release structure from an engaged position in which the engage structure extends through the latch port engaging the circuit board assembly, to a released position in which the engage structure is displaced away from the circuit board assembly releasing the circuit board assembly permitting the circuit board assembly to be removed; and resilient means between the engage structure and the release structure of each assembly latch, for resiliently loading each assembly latch toward the engaged position for maintaining the assembly latches in the engaged position after the installation of the circuit board assembly.

21. The computer apparatus of claim 20, wherein the end edges of the thermal plate have an indentation therealong which accepts the engage structure of the assembly latches when the assembly latches are in the engaged position to engage the circuit board assembly.

* * * * *